United States Patent [19]
Ammon et al.

[11] Patent Number: 6,117,230
[45] Date of Patent: Sep. 12, 2000

[54] PROCESS FOR PRODUCING A SILICON SINGLE CRYSTAL, AND HEATER FOR CARRYING OUT THE PROCESS

[75] Inventors: Wilfried Von Ammon, Burghausen; Erich Tomzig, Burgkirchen, both of Germany; Paul Fuchs, Schalchen, Austria; Yuri Gelfgat, Riga, Latvia

[73] Assignee: Wacker Siltronic Gesellschaft für Halbleitermaterialien AG, Burghausen, Germany

[21] Appl. No.: 08/977,584

[22] Filed: Nov. 25, 1997

[30] Foreign Application Priority Data

Dec. 17, 1996 [DE] Germany .......................... 196 52 543

[51] Int. Cl.[7] .................................................. C30B 15/14
[52] U.S. Cl. .............................. 117/13; 117/30; 117/217; 117/932
[58] Field of Search ................................. 117/13, 30, 932, 117/217

[56] References Cited

U.S. PATENT DOCUMENTS

| 4,619,730 | 10/1986 | Suzuki et al. .......................... 117/13 |
| 4,622,211 | 11/1986 | Suzuki et al. .......................... 117/30 |
| 4,659,423 | 4/1987 | Kim et al. .............................. 117/13 |
| 4,915,775 | 4/1990 | Katsuoka et al. ...................... 117/932 |
| 5,162,072 | 11/1992 | Azad . |
| 5,360,599 | 11/1994 | Cueman et al. . |

FOREIGN PATENT DOCUMENTS

| 0628645 | 12/1994 | European Pat. Off. . |
| 1515916 | 3/1968 | France . |
| 1289519 | 10/1969 | Germany . |

OTHER PUBLICATIONS

Patent Abstracts of Japan vol. 8, No. 241 (C–250) a JP 59 121183 A (Fujitsu UU).

Giess et al.: "Combination Heater—Magnetic Soleroid Coils for Suppressing Melt Convection in Crystal Growth", IBM Technical Disclosure Bulletin, Bd. 26, No. 9, Feb. 1984 NY US, p. 4716, XP00205U780.

*Primary Examiner*—Robert Kunemund
*Attorney, Agent, or Firm*—Collard & Roe, P.C.

[57] ABSTRACT

A process for producing a silicon single crystal by the Czochralski method, utilizes a heater which is intended for heating a silicon-filled crucible and is arranged below the crucible. The process has energy delivered to the melt at least some of the time inductively using a coiled heater arranged under the crucible. The heater is in the form of a wound coil.

6 Claims, 3 Drawing Sheets

PROCESS FOR PRODUCING A SILICON SINGLE CRYSTAL, AND HEATER FOR CARRYING OUT THE PROCESS

BACKGROUND OF THE INVENTION

1. Field of the Invention

The present invention relates to a process for producing a silicon single crystal by the Czochralski method. The invention also relates to a heater which is intended for heating a crucible filled with silicon and is arranged below the crucible.

2. The Prior Art

For the production of silicon single crystals by the Czochralski method, solid silicon is melted in a quartz-glass crucible, also referred to hereafter as just "crucible". A seed crystal is then dipped into the melt and a single crystal is pulled from the melt. Since its incipience, the method has continued to be developed, and it is currently possible to pull single crystals having diameters in excess of 200 mm.

However, producing large single crystals raises a number of problems. One of these problems relates to the thermal and rheological conditions when the silicon is melted and when the single crystal is pulled. It is desirable to melt the silicon as quickly as possible and to obtain thermal and rheological conditions in the melt that are necessary for dislocation-free pulling of the single crystal. In order to produce large single crystals, correspondingly large volumes of silicon need to be melted in the crucible. As a rule, use is made of polycrystalline fragments or single crystals which contain dislocations and need to be remelted.

The heating energy required for the melting is usually provided by resistive heating elements which are arranged around the sides of the crucible and below the crucible. A device having heating elements of this type is, for example, disclosed in U.S. Pat. No. 5,360,599. A factor against melting the silicon quickly by heating the heating elements to temperatures which are much higher than the melting point of silicon is the fact that liquid silicon attacks the crucible if the wall of the crucible is overheated. There is a risk of particles being detached from the material of the crucible, reaching the crystallization front during the pulling of the single crystal, and causing dislocations. An excessive temperature gradient between the wall of the crucible and the crystallization front furthermore produces uncontrolled convection currents. These currents in turn lead to undesired local fluctuations in the temperature of the melt and the concentration of dopant and impurities in the melt.

SUMMARY OF THE INVENTION

It is an object of the present invention to reduce the time taken to melt silicon in a quartz-glass crucible, while protecting the crucible from overheating and while stabilizing the melt.

The present invention achieves this object by providing a process for producing a silicon single crystal comprising melting silicon in a quartz-glass crucible to form a silicon melt; pulling the silicon single crystal from said silicon melt; and delivering energy to the silicon melt at least some of the time inductively using a coiled heater arranged under the crucible.

The present invention also relates to a heater for heating a silicon filled crucible comprising means for placing a heater below a silicon filled crucible; and wherein the heater is a wound coil, and this coil has turns.

A particular distinguishing feature of the invention is that heat energy is not only transferred directly to the silicon melt, but is also distributed quickly and uniformly in the melt by the field-induced melt convection. Because of the substantially higher electrical resistance of the other furnace components (graphite), the energy is delivered predominantly to the melt. The manner in which the heat energy is transferred, and the described consequences, significantly reduce the time required to melt the silicon. Furthermore, the crucible is protected by the thermal transport directed into the interior of the crucible from overheating by the resistive heater arranged around its sides. During the pulling of the single crystal, the convection forced in the melt by inductive heating can be used to reduce uncontrolled local fluctuations in the temperature and the concentration of dopants and impurities, and to stabilize the melt. This in turn promotes the pulling of a dislocation-free and uniformly doped single crystal.

Since it is only in the liquid state that silicon has the desired interaction with the induced electromagnetic field, at the start of the process solid silicon is melted with the aid of a resistive heater. A conventional heater can be arranged around the crucible. It is also possible for a heater according to the invention, referred to hereafter as a bottom heater, to be used for this resistive heating. The bottom heater is connected to a DC current source and is operated for resistive heating. However, to melt most of the silicon, the bottom heater is switched to alternating-current operation, so that the energy transferred to the silicon takes place inductively. A sinusoidal AC voltage, and AC voltage modulated with DC voltage components or an AC voltage produced by repeated switching is preferably applied.

The frequency of the AC voltage is preferably from 20 Hz to 10 kHz. For higher frequencies of the AC voltage, the melt undergoes stronger local heating than at lower frequencies. However, at lower frequencies the energy delivery reaches further into the interior of the crucible. It is therefore recommended, when melting the silicon, to work initially at higher frequencies in order to melt silicon as fast as possible. Then later it is desirable to change the operation to operate at lower frequencies in order to stabilize the melt. During the pulling of the single crystal, the bottom heater can be operated either with direct current, with a customary resistive heating function, or, to stabilize the melt further, with alternating current or with modulated direct current.

If the heater is operated with modulated direct current, it is also possible for the oxygen content of the melt to be controlled. The oxygen content is, in particular, influenced by the speed of the convection movement in the melt. The AC component of the modulated current determines the power delivered to the melt and therefore the convection drive, while the required overall heating power of the heater is controlled with the DC component. The convection speed can therefore be controlled independently of the total heat application by varying the modulation amplitude.

A further embodiment for controlling the oxygen content in the melt comprises selecting a relatively strong modulation amplitude and thereby setting up a high convection speed. Then there is braking of this speed deliberately by a external static magnetic field which penetrates the melt.

Another embodiment for influencing the oxygen content of the melt is afforded by varying the frequency of the AC component. This is because the change in frequency varies the penetration depth of the electromagnetic field into the melt and therefore the convection of the melt.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
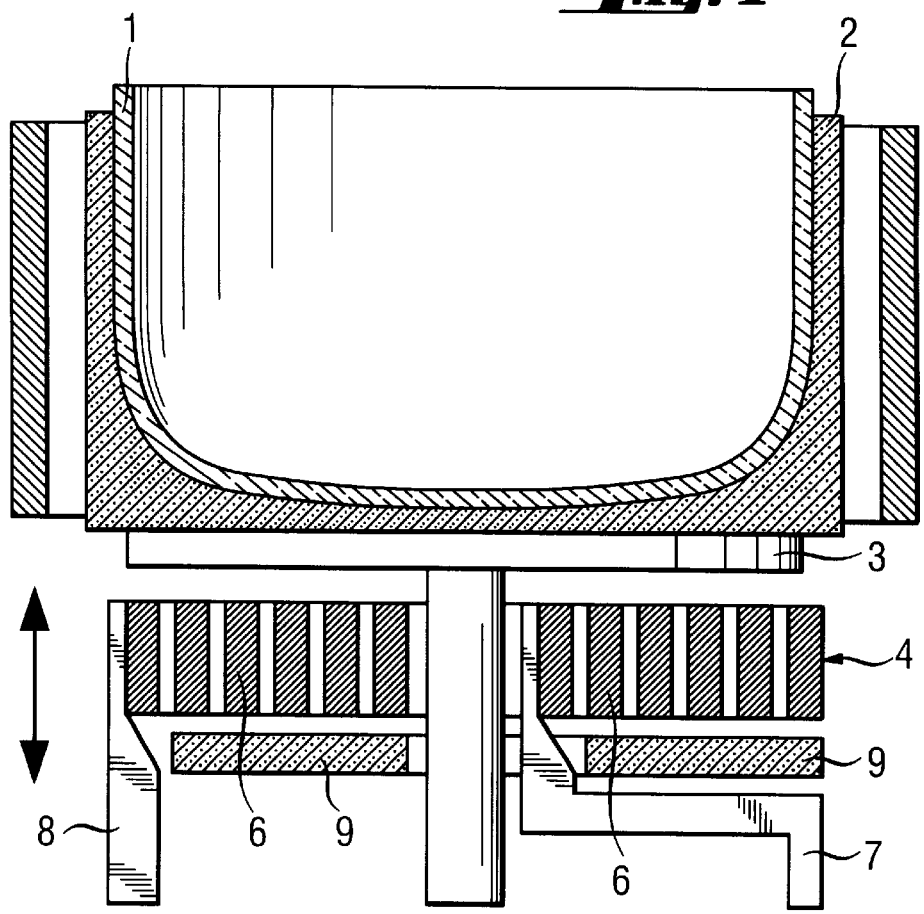
FIG. 1 shows a longitudinal cross section view through a device for pulling a single crystal by the Czochralski method, with a heater according to the invention.

Turning now in detail to the drawings, FIG. 1 represents a quartz-glass crucible 1 which is embedded in a support crucible 2 and, together with the latter, is supported on a support plate 3 of a rotatable and axially displaceable shaft. The crucible 1 is surrounded at its sides by a cylindrical resistive heater. A bottom heater 4 according to the invention is arranged below the crucible. Radial slots (not represented in the figure) reduce undesired inductive coupling to the support crucible 2. Correspondingly, other device parts next to the bottom heater are preferably also radially slotted.

The bottom heater 4 comprises essentially a coil which is preferably made of graphite, CFC (carbon fiber composite) or metals such as molybdenum or tantalum. The turns 6 of the coil lead in widening paths from an inner electrical connection 7 to an outer electrical connection 8. The number of turns is dictated by the coil material. Coils made of carbon have, because of the higher electrical resistivity of this material, fewer turns than metal coils of the same total diameter. The turns of the coil may be arranged in a single layer or in a plurality of layers, one above the other.

Below the bottom heater there is a thermally insulating base plate 9. It is preferable for each of the turns of the coil to be fixed mechanically to the base plate at at least three support points. For example, it is possible to use support elements which are fitted to the turns and are electrically insulating or are made of electrically insulating material. The support elements at the same time hold the turns of the coil at a constant distance from one another and damp possible vibrations of the turns. The base plate is preferably made of graphite and desirably serves at the same time as an electrical connection for the inner electrode of the bottom heater.

Figure 2:
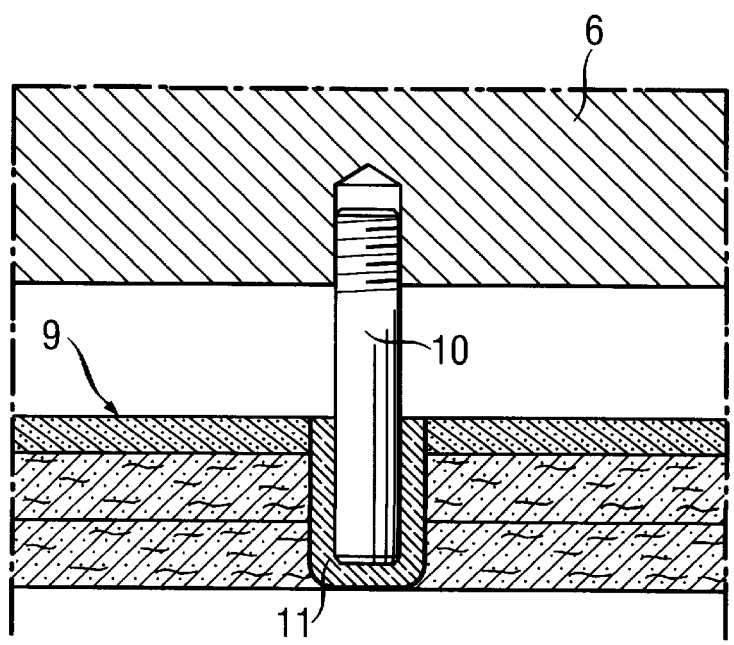
FIG. 2 shows a bridging element for the heater of the invention.

The support element used may, for example, be the bridging element 10 which is shown in FIG. 2. Element 10 is connected to a turn 6 and protrudes from the turn 6 in the manner of a foot. In the embodiment which is shown, the base plate 9 consists of a composite formed by a graphite plate and underlying graphite-felt plates. The bridging element 10 fits into a socket 11 which is preferably made of quartz glass. The socket is embedded in a corresponding bore in the base plate.

Figure 3:
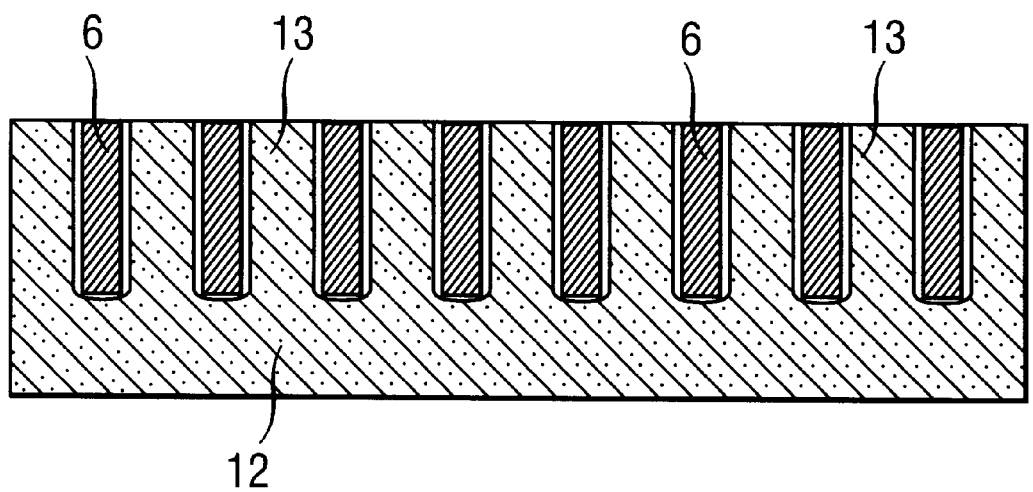
FIG. 3 shows a comb shaped electrically insulating spacer for the heater of the invention.

FIG. 3 shows a further embodiment of how the turns of the coil 6 can be supported on a base plate. In this case, a comb-shaped electrically insulating spacer 12, is preferably made of boron nitride. Spacer 12 can be resting on a base plate (not represented), and here functions as the support element. On one side, the spacer 12 has prongs 13 which are fitted into the gaps between the turns 6.

Figure 4:
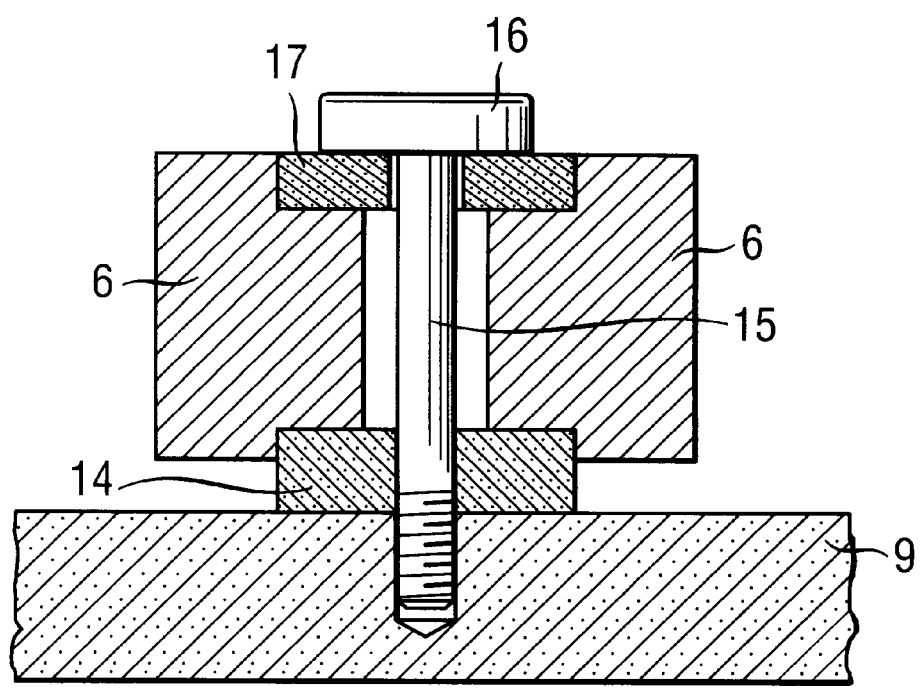
FIG. 4 shows an annular electrically insulating spacer for the heater of the invention.

Another embodiment for constructing the support for the turns is shown in FIG. 4. The proposed support element is an annular, electrically insulating spacer 14 which supports two adjoining turns 6 and is screwed to a base plate 9 using a screw 15. The head 16 of the screw fixes the turns 6 to the spacer 14 via an insulating washer 17. The screw is preferably made of CFC. The spacer and the washer preferably consist of boron nitride.

Another similar possibility (not represented) of supporting a turn consists in the turn being supported on the base plate by an annular, electrically insulating spacer. In this case, it is expedient to connect the turn to the base plate, for example by a screw, which is electrically insulating or is made of electrically insulating material, being screwed into the turn through the base plate and the spacer. If the base plate is made of electrically insulating material, for example boron nitride, the turns can be fastened directly to the base plate by CFC screws.

During the pulling of a single crystal, it is usual to raise the crucible using the shaft, in order to keep the surface of the melt at constant level in spite of the decreasing volume of the melt. Since the amount of energy delivered depends on the distance between the bottom heater and the crucible, it is preferable to coordinate the bottom heater to the axial movement of the crucible. It is also desirable to keep the bottom heater distance constant from the crucible. In principle, a separate mechanism may be provided for this, which moves the bottom heater synchronously with the crucible.

Figure 5:
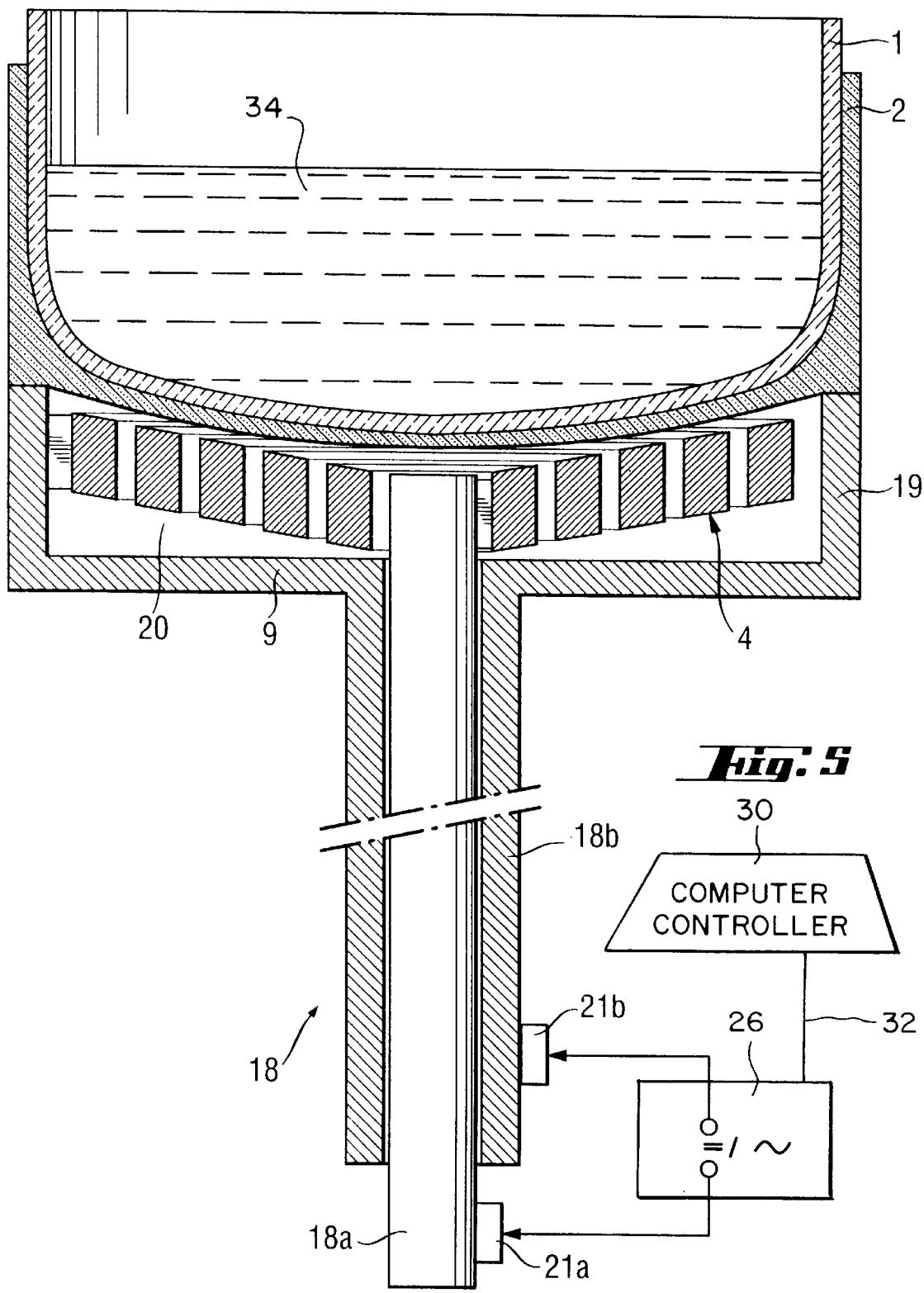
FIG. 5 shows a preferred embodiment for the heater of the invention.

In a preferred embodiment, axial movements of the crucible and of the bottom heater are brought about by a specially designed shaft 18 (shown in FIG. 5). The shaft 18 is divided into two coaxial parts 18a and 18b, with the inner part 18a being designed as an inner electrical connection of the bottom heater 4. Together with a base plate 9 and a tube 19, the outer part 18b serves as an outer electrical connection for the bottom heater and at the same time supports the base plate 9. Together with the tube 19 and a support crucible 2, the base plate forms a cavity 20 which contains the bottom heater 4. The bottom heater is substantially enclosed in the cavity, so that impurities originating from it cannot reach the melt via the gas phase. The electrical connections are joined to a current source or power supply 26 via slip rings 21a and 21b.

FIG. 5 also shows an embodiment for controlling the operation of the heating stages during the course of the method of the invention. Specifically computer controller 30 controls the operation of the electrical power supply means 26. Thus, during the process the computer controller 30 can send instructions over lead 32 to power supply 26, which will enable the delivering of energy to the silicon melt 34 at least some of the time inductively using the coiled heater 4 arranged under the crucible.

In another embodiment, computer 30 can send instructions over lead 32 to the electrical power supply 26 for operating the heater 4 at least some of the time with alternating current during the melting of the silicon.

In a further embodiment, computer 30 instructs the power supply for varying the frequency of the alternating current. In another embodiment, computer 30 controls the power supply 26 for operating the heater at least some of the time with modulated direct current during the melting of the silicon.

In a further embodiment, computer 30 controls the power supply 26 for operating the heater with direct current during the pulling of the silicon single crystal. In another embodiment, computer 30 controls the power supply 26 for operating the heater with alternating current during the pulling of the silicon single crystal.

In a further embodiment, computer 30 controls the power supply 26 for operating the heater with modulated direct current during the pulling of the silicon single crystal and for varying the ratio between an AC component and a DC component. In another embodiment, computer 30 controls the power supply 26 for operating the heater with modulated direct current during the pulling of the silicon single crystal and for providing a static magnetic field which penetrates the melt 34. In a further embodiment, computer 30 controls the power supply 26 for operating the heater with modulated direct current during the pulling of the silicon single crystal and for varying the frequency of the AC component.

While several embodiments of the present invention have been shown and described, it is to be understood that many changes and modifications may be made thereunto without departing from the spirit and scope of the invention as defined in the appended claims.

What is claimed is:

1. Process for producing a silicon single crystal comprising
    melting silicon in a quartz-glass crucible to form a silicon melt;
    pulling the silicon single crystal from said silicon melt;
    delivering energy to the silicon melt at least some of the time inductively using a coiled heater arranged under the crucible;
    operating the heater at least some of the time with alternating current during the melting of the silicon; and
    operating the heater at least some of the time with modulated direct current during the pulling of the silicon single crystal.

2. Process according to claim 1, comprising
    varying the frequency of the alternating current.

3. Process according to claim 1, comprising
    operating the heater at least some of the time with modulated direct current during the melting of the silicon.

4. Process for producing a silicon single crystal comprising
    melting silicon in a quartz-glass crucible to form a silicon melt;
    pulling the silicon single crystal from said silicon melt;
    delivering energy to the silicon melt at least some of the time inductively using a coiled heater arranged under the crucible;
    operating the heater with modulated direct current during the pulling of the silicon single crystal; and
    varying the ratio between an AC component and a DC component.

5. Process according to claim 1, comprising
    operating the heater with modulated direct current during the pulling of the silicon single crystal; and
    providing a static magnetic field which penetrates the melt.

6. Process for producing a silicon single crystal comprising
    melting silicon in a quartz-glass crucible to form a silicon melt;
    pulling the silicon single crystal from said silicon melt;
    delivering energy to the silicon melt at least some of the time inductively using a coiled heater arranged under the crucible;
    operating the heater with modulated direct current during the pulling of the silicon single crystal; and
    varying the frequency of the AC component.

* * * * *

UNITED STATES PATENT AND TRADEMARK OFFICE
CERTIFICATE OF CORRECTION

PATENT NO.    : 6,117,230
DATED         : September 12, 2000
INVENTOR(S)   : Von Ammon et al.

It is certified that error appears in the above-identified patent and that said Letters Patent is hereby corrected as shown below:

<u>Title page,</u>
Item [19], change "Ammon et al" to correctly read: -- Von Ammon et al --.

Signed and Sealed this

Twenty-fourth Day of December, 2002

JAMES E. ROGAN
*Director of the United States Patent and Trademark Office*